United States Patent [19]
Yamada

[11] 4,212,000
[45] Jul. 8, 1980

[54] POSITION-TO-DIGITAL ENCODER

[75] Inventor: Seiji Yamada, Saki, Japan

[73] Assignee: Minolta Camera Kabushiki Kaisha, Osaka, Japan

[21] Appl. No.: 935,390

[22] Filed: Aug. 21, 1978

[30] Foreign Application Priority Data

Aug. 20, 1977 [JP] Japan .................................. 52-100017
Oct. 2, 1977 [JP] Japan .................................. 52-106016

[51] Int. Cl.² ............................................. G08C 9/08
[52] U.S. Cl. ............................ 340/347 P; 354/23 D; 340/347 DD; 200/11 R
[58] Field of Search ............. 200/11 R, 11 DA, 11 G, 200/11 J; 340/347 P, 347 DD; 354/23 D, 24

[56] References Cited

U.S. PATENT DOCUMENTS

| | | | |
|---|---|---|---|
| 2,666,912 | 1/1954 | Gow | 340/347 P |
| 2,752,093 | 6/1956 | Bush | 340/347 P |
| 2,872,671 | 2/1959 | Walton | 340/347 P |
| 3,141,160 | 7/1964 | Hartke | 340/347 P |
| 3,206,740 | 9/1965 | Maclay | 340/347 P |
| 3,688,304 | 8/1972 | Rasch | 340/347 P |
| 3,710,375 | 1/1973 | Brean | 340/347 P |

Primary Examiner—Charles D. Miller
Attorney, Agent, or Firm—Watson, Cole, Grindle & Watson

[57] ABSTRACT

A position-to-digital encoder for generating digital signals in the form of binary code in accordance with the relative positions between a pair of brush contacts and a series of contacts arranged in order. The latter contacts are disposed in a row along the path of movement of the brush contacts, with equal pitches and gaps between adjacent contacts. The brush contacts are spaced from each other along their path of movement with such a distance that two brush contacts are in contact with a single one of the series of contacts or with an adjacent two of the series of contacts, respectively. One line extends from each contact to a decoder which generates signals in accordance with which contact or contacts of the contact series is engaged by the brush contacts. The decoder generates different signals in accordance with whether a single or double contact is engaged by the brush contacts so that (2n-1) different signals may be obtained as a function of the relative position between the brush, contacts and the series of contacts, where n is the number of the latter contacts.

11 Claims, 7 Drawing Figures

PRIOR ART
FIG. 1
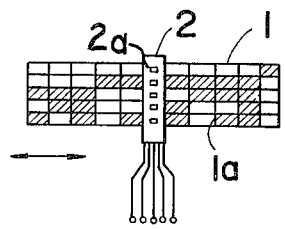
FIG. 2
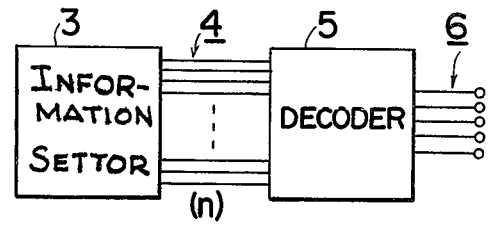
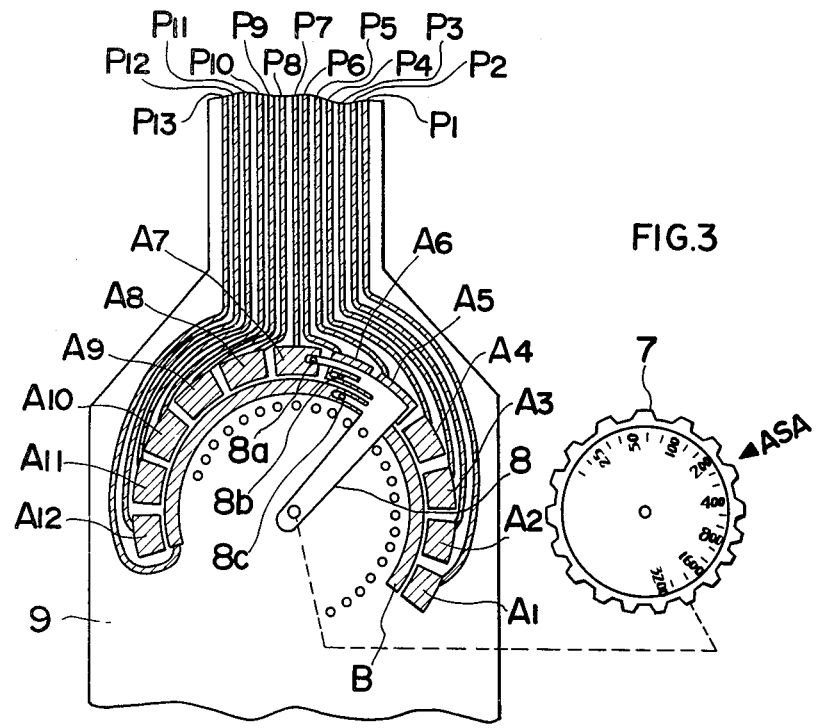
FIG. 3
FIG. 4
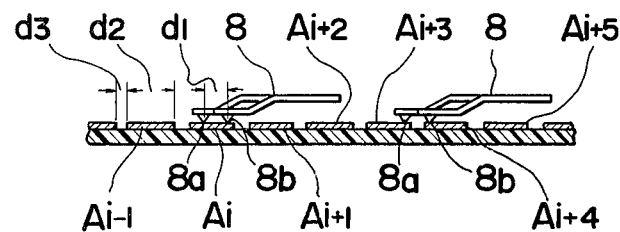

POSITION-TO-DIGITAL ENCODER

BACKGROUND OF THE INVENTION

1. Field of the Invention

The present invention relates to a position-to-digital encoder for generating binary coded electric signals in accordance with the relative positions between a brush member and a series of contacts arranged in order. The combination of the brush member and a series of contacts may be replaced by a combination of a light emitting member and a series of light sensitive elements. Thus, it is to be understood that although reference is made to the brush member and the series of contacts for the convenience of describing the invention, such terminology includes the above replacement. The digital encoder according to the present invention is suitable, although not exclusively, for use in camera exposure control circuitry which determines, or electrically sets, a binary coded signal to represent a set exposure factor or the position of an exposure setting member for a camera.

2. Prior Art

Apparatus are known or have been proposed which control the exposure time, diaphragm aperture or both, of cameras utilizing digital signals in the form of a binary code. Encoders employing a binary coded plate, as shown in FIG. 1, for obtaining binary coded signals representative of set exposure factors, such as film sensitivity or preset diaphragm aperture value, or the positions of an exposure setting member for an automatically controlled exposure factor, are known. The encoder of FIG. 1 includes code plate 1 with electrically conducting portions 1a (blackened positions in the Figure), brush plate 2 with a plurality of contacts 2a slidable over code plate 1 in the directions of the arrows, and electrical lines leading from each contact. With that construction, signals appear at the lines connected to the respective contacts that are in contact with conducting portions 1a so that binary coded signals are obtained through the lines in accordance with the position of brush plate 2 relative to code plate 1. The movement of brush plate 2 is associated with, for example, the setting of an exposure factor, so that the binary coded signal represents the set exposure factor.

However, the above construction has disadvantages, especially when it is used for cameras. In general the elements of a camera are required to be as small as possible. However, the above mentioned encoder has a limit with respect to a reduction of its dimensions, because it must have a width for accomodating the number of bits corresponding to that of the contacts on brush plate 2, and a length accomodating the number of signals to be discriminated. In other words, the number of the segments, i.e. conducting and non-conducting portions on code plate 1 must be equal lengthwise to the number of the exposure factor settings and widthwise to the number of the binary coded digits.

In addition, the above structure is liable to provide incorrect information when the contacts are at a boundary between adjacent segments and in contact with two rows of the segments. For example, if the contacts are at the boundary between the rows of segments representing 3 and 4 respectively, and as the binary digits for 3 and 4 are 011 and 100, the contacts detect conducting portions in both rows to provide a signal of 111, i.e. 7 in the decimal system. This error is likely to occur more frequently with reduced dimensions and increases in the number of bits.

SUMMARY OF THE INVENTION

It is accordingly the primary object of the present invention to provide a position-to-digital encoder which is compact in size and free from the above mentioned errors.

It is another object of the present invention to provide such an encoder suitable for use in a camera exposure control system.

It is still another object of the present invention to provide an encoder which generates binary coded signals in accordance with the position of a brush member relative to a series of contacts, and which occupies minimum space for the brush and contacts, but with high discrimination accuracy.

According to the present invention, a single row of conducting segments are arranged in order, along which a pair of brush contacts are slidable, the brush pair coming into contact with one or two of the contact series, and from which are led a corresponding number of lines to a decoder having the capability of discriminating whether the pair of brush contacts are in contact with a single or a double contact of the contact series.

BRIEF DESCRIPTION OF THE DRAWINGS

FIG. 1 illustrates schematically a prior art device;

FIG. 2 is a block diagram illustrating the basic concept of the present invention;

FIGS. 3 and 4 are respective plan and side views of a brush-contact structure according to an embodiment of the present invention;

DETAILED DESCRIPTION OF THE PREFERRED EMBODIMENTS

Figure 5:
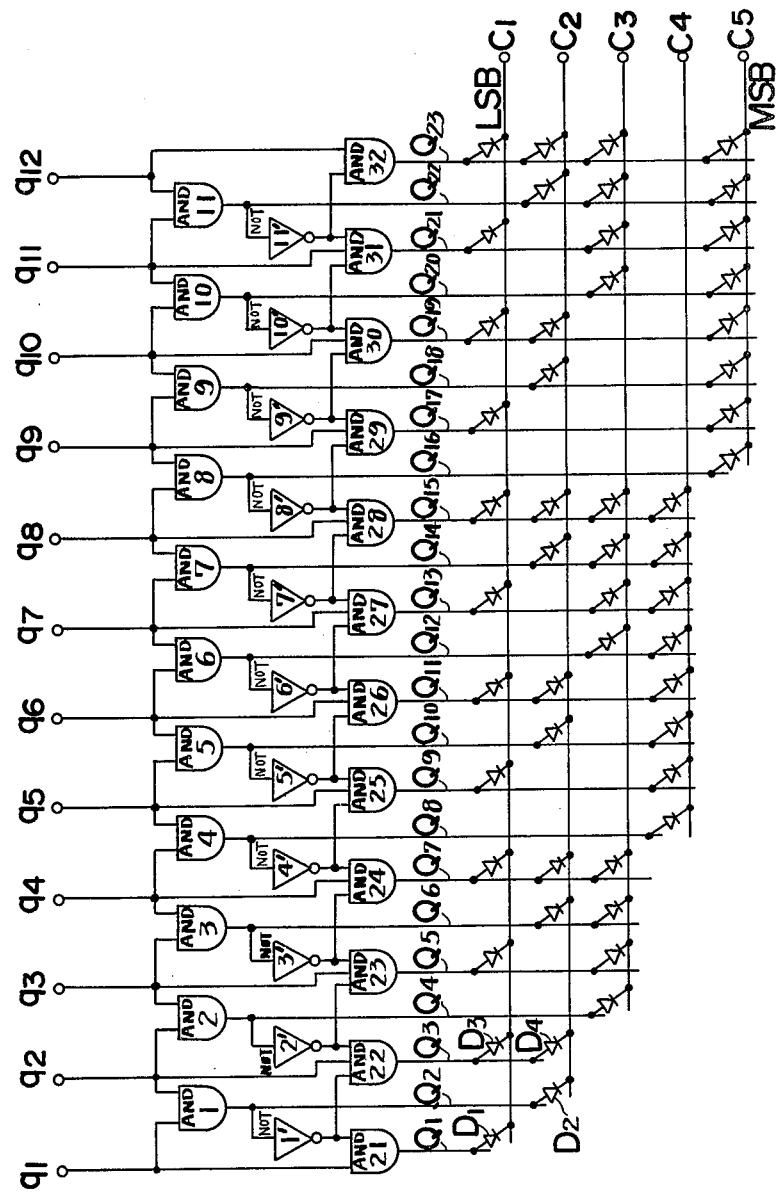
FIG. 5 is a circuit diagram showing an embodiment of a decoder circuit of the present invention.

Referring to FIG. 2, which illustrates a basic concept of the present invention, information settor 3 is connected to a decoder 5 through lines 4. At the information settor 3, $2n$ kinds or pieces of information are settable, wherein n is the number of lines. In other words the number of lines n transmits $2n$ kinds of information to decoder 5, which in turn converts the $2n$ kinds of information into a corresponding number of binary coded signals. In this construction, one kind of information is transmitted by a single line and another kind of information is transmitted by an adjacent two lines, so that only n lines are required for the transmission of $2n$ kinds of information. Lines 4 are respectively connected to electrically conducting contacts, and one, or an adjacent two of the contacts, are engageable by a brush or slider member, with the decoder 5 receiving information of the position of the brush member through the line or lines connected to the contact or contacts engaged by the brush member. The present invention is characterized in making use of two kinds of engaging conditions between the brush member and the contact or contacts.

Referring to FIG. 3, which shows an embodiment of the information settor according to the present invention, the illustrated embodiment is arranged to enable the setting of 24 kinds or pieces of information. If the embodiment is used for film sensitivity setting, the number of the kinds of information correspond to the number of steps of the film sensitivity counted by every $\frac{1}{3}$ step from the value $\frac{2}{3}$ step less than ASA25 to the value of ASA 3600. In FIG. 3, brush member 8 is mechanically linked with film sensitivity setting dial 7 to pivot about pivotal axis 8d in accordance with the film sensitivity setting. Brush member 8 has three brush contacts 8a, 8b and 8c. Brush contacts 8a and 8b are slidable over a series of fixed contacts A1 through A12 arranged arcuately along the path of brush contacts 8a and 8b. Leads P1 through P12 which correspond to lines 4 of FIG. 2 are respectively connected to fixed contacts A1 through A12. The third brush contact 8c is always in sliding contact with auxiliary conductor B disposed inside of fixed contacts A1 through A12 and connected to lead P13. The above fixed contacts A1 through A12, auxiliary conductor B, and leads P1 through P13 are arranged on insulating base plate 9, made of a plastic or synthetic resin material, by means of a known print wiring technique.

Fixed contacts A1 through A12 have the same shape and size and are arranged with the same pitch and with such a dimensional relationship with brush contacts 8a and 8b that the length d2 of each fixed contact is a little larger than the distance d1 between brush contacts 8a and 8b with respect to the direction of the movement of the brush contacts. The gap d3 between each of the adjacent fixed contacts is smaller than the distance d1 as shown in FIG. 4. According to this dimensional relationship, the two brush contacts 8a and 8b assume either of two locational conditions, i.e. both on a single fixed contact Ai or respectively on adjacent fixed contacts Ai and Ai+1. Hence, if the two locational conditions are discriminated, the n fixed contacts (n is the number of the contacts) can provide or present 2n-1 kinds or pieces of information. If a high level voltage corresponding to the binary signal "1" is applied through lead 13 to auxiliary conductor B, the voltage signal is transmitted through brush contact 8c to brush contacts 8a and 8b to produce the binary signal "1" at the lead or leads connected to the fixed contact or contacts with which the brush contacts 8a and 8b are in contact. The binary "1" signal, thus produced, is then applied to the corresponding input terminal of decoder 5 which generates a binary code signal in accordance to which input terminal or terminals the signal is applied. Thus the binary signal "1" presents twenty-three kinds of information in dependence on the lead through which the signal is transmitted.

Referring to FIG. 5, which shows an embodiment wiring or decoder 5 shown in FIG. 2, the decoder 5 may be formed as an integrated circuit. Input terminals q1 through q12 are respectively connected to a corresponding one of leads P1 through P12. At output terminals C1 through C5 are generated binarily converted outputs from the inputs applied to one or two of the terminals q1 through q12.

For example, if a binary signal "1" is applied only to terminal q3, the output of AND gate 2 is "0" because the input at the lefthand input terminal thereof is "0", although the input at the righthand terminal is "1". The output "0" of AND gate 2 is inverted by NOT gate 2' into binary signal "1", which in turn is applied to the lefthand input terminal of AND gate 23 with the input at the righthand terminal of AND gate 23 being "1", so that AND gate 23 generates a high level signal to make outputs C1 and C3 high level through the diode matrix circuit, with the high level at the outputs C1 and C3 representing "5" in the binary system. The righthand input of the AND gate 23 is the output of AND gate 3 which generates a "0" signal in response to a "0" signal at terminal q4, with the "0" output of AND gate 3 being inverted by NOT gate 3' before being applied to AND gate 23. In the above situation, the binary "1" signal from terminal q3 is also directly applied to the center input terminal of AND gate 23.

If the inputs at terminals q3 and q4 are both "1", the center and lefthand terminals of AND gate 23 are "1" in the same manner as mentioned above, but the righthand terminal is "0" because the binary signal "1" of AND gate 3 is inverted to "0" by NOT gate 3' and applied to the righthand terminal of AND gate 23. Thus, the output of AND gate 23 is "0". The "0" signal from NOT gate 3' also makes the output of AND gate 24 "0". Consequently, a high level signal is applied to the diode matrix only through the direct line from the output of AND gate 3 which is "1" as explained above, so that outputs C2 and C3 assume a high level, representing "6" in the binary system.

If the signal on lead P13 is made to assume a low level representing a binary "0" signal, then all the input terminals q1 through q12 assume a "0" level to make all the outputs of AND gates 1 through 11 and 21 through 32 low level, so that the level of all output lines Q1 through Q23 will be "0" with all the output terminals C1 through C5 assuming a "0" level, which represents "00000" in the binary system, i.e. "0" in the decimal system. Thus, if such "0" condition is regarded as one piece of information, then the decoder provides twenty-four pieces of information in the binary code. The least significant bit LSB appears at output C1 and the most significant bit MSB appears at output C5.

Figure 6:
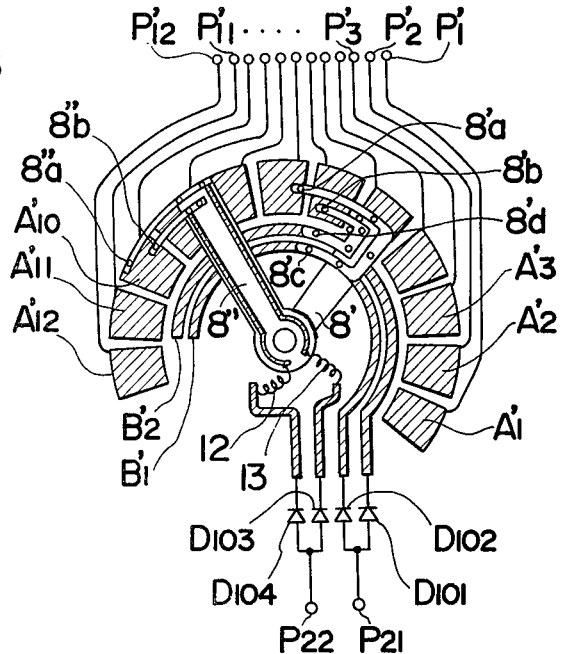
FIG. 6 is a schematic plan view of another embodiment of the brush-contact structure and FIG. 7 is a schematic plan view of a diaphragm control mechanism for another application of the present invention.

Referring to FIG. 6, which shows another embodiment of the information settor 3, the structure is arranged such that two series of information, e.g. film sensitivity and diaphragm aperture value, may be set on a single series of fixed contacts A'1 to A'12. In other words, the series of fixed contacts is commonly used for dual settings. First and second brush supporting plates 8' and 8" are made of insulating material and pivotable independently of each other. Brush contacts 8'a, 8'b and 8"a, 8"b, respectively supported on plates 8' and 8" are electrically separated from each other. Brush contacts 8'a, 8'b are connected through auxiliary brushes 8'c, 8'd to auxiliary conductors B'1, B'2, which are disposed in semicircular form inside of fixed contacts A'1 through A'12. Brush contacts 8'a, 8'b are also connected through diodes D101 and D102, respectively, to common input P21 from which a high level signal may be applied. Brush contacts 8"a and 8"b are supported by plate 8" and connected directly through coiled wires 12, 13 and diodes 103, 104 to common input P22 from which a high level signal may be applied. It is to be understood that the brush contacts supported by plates 8' and 8" are arranged to slide along a different locus.

With the above-described construction, the two series of information may be encoded respectively by a time-sharing system, with the high level and low level signals being alternatively applied to the input terminal P21 and P22. For example, if a high level signal is applied to terminal P21, at any one or two of leads P1' through P12' a high level signal is generated in accordance with the position of the contacts on plate 8' relative to fixed contacts A1' through A12'. Leads P1' through P12' may be connected with two decoders in accordance with the number of series of information, with the decoders being selected in accordance with which of the terminals P12 and P22 assumes a high level, whereby two series of information are processed simultaneously.

It will be easily understood by those skilled in the art that the fixed contacts may be disposed linearly instead of circularly or arcuately as mentioned above. Further, the base plate supporting the fixed contacts may be moved relative to the brush contact which may be fixed or movable as the case may be.

Figure 7:
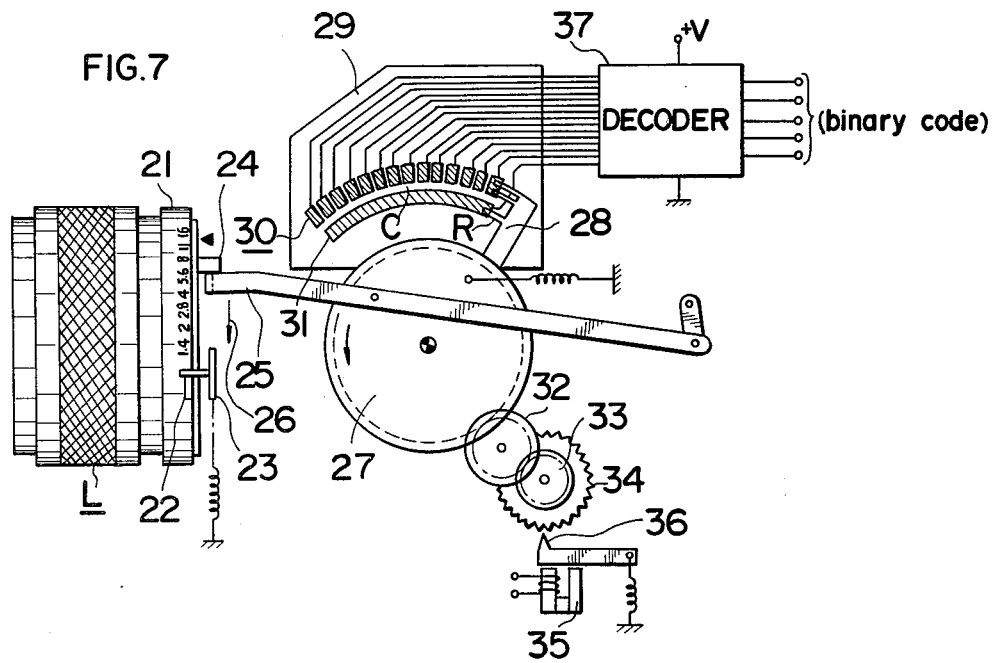

FIG. 7 shows another application of the present invention wherein the combination of a series of contacts C and brush contacts R is employed for the representation of the diaphragm aperture operation. Interchangeable lens L is detachably mountable on a single lens reflex camera (not shown) in a well known manner. Interchangeable lens L is provided with diaphragm aperture preset ring 41 for setting a diaphragm aperture value before operation of the camera. The diaphragm aperture is fully open for observation and light measurement of the scene to be photographed. On the preset ring 41 is fixed a coupling pin 42 engageable with engaging member 43 on the camera so that information of the diaphragm aperture setting is transmitted to the camera body. Diaphragm driving member 44 is mechanically interlocked with a diaphragm in the interchangeable lens to determine the diaphragm aperture as a function of the position of the driving member. Diaphragm driving member 44 is spring-biased in the direction of arrow 46 and engages the free end of link lever 45 which is pivoted on a rotary disk 47 and on a short link 48. Disk 47 is biased clockwise by spring 49 and includes on its periphery gear teeth interlocking through gears 52 and 53 with ratchet wheel 54 engageable by claw 56. Electromagnet 55 includes a permanent magnet on its core to normally attract claw 56 and hold it in its retracted position against the biasing force of spring 57 until the electromagnet coil in energized to offset the magnetic field of the permanent magnet and allow claw 56 to be moved into engagement with the teeth of ratchet wheel 54.

On rotary disk 47 is fixedly mounted a brush supporter 58 supporting brush contacts slidable over a series of fixed contacts 60 and auxiliary conductor 61. Fixed contacts 60 are connected through lines 62 to decoder 63. The above mentioned brush contacts R, fixed contacts 60, auxiliary conductor 61 and lines 62 have substantially the same construction as that shown in FIG. 3. Decoder 63 may have the construction substantially the same as that shown in FIG. 5.

With the above explained structure, the output of decoder 63 in the form of a binary code may be compared by comparator 70 with an output of a diaphragm control signal generating circuit 72 which generates a signal representative of a suitable diaphragm aperture for a set film sensitivity, set shutter speed and the brightness of an object to be photographed, in accordance with the outputs of a light measuring circuit and exposure factor setting circuits, as is well known to those skilled in the art. The signal processing by the diaphragm control signal generating circuit may be carried out digitally. For this purpose, the exposure factor setting circuits may be constructed as shown in FIG. 3 or 6.

Returning to the structure of FIG. 7, in response to camera actuating operation the diaphragm driving member 44 is actuated with the preset ring 41 set to a minimum aperture position, to drive the diaphragm and the rotary disk 47 so that brush contacts R are moved from the position shown in the Figure to the left to change the output of decoder 63. If the output of decoder 63 reaches a predetermined value with respect to the output of the diaphragm control signal generating circuit, then the electromagnetic coil of electromagnet 55 is energized to allow claw 56 to move into engagement with ratchet wheel 54, thereby stopping the diaphragm via disk 47 and link lever 45 to determine the diaphragm aperture.

Although the above explanation is made with respect to a camera exposure control system, the present invention is not limited to such an application. For example, structure similar to that of FIG. 7 may be used for automatic focus control of the camera objective. Further, the present invention may be applied to various control systems for apparatus other than cameras.

We claim:

1. A digital code signal generating device comprising:
 at least one set of a plurality of conducting elements each arranged in a row with each of said conducting elements having the same pitch and the same length with respect to the direction of the row, and said conducting elements being spaced to have the same gap between adjacent conducting elements;
 at least one pair of brush contacts slidable over said at least one set of conducting elements along the direction of said row, and being spaced from one another in the direction of the row such that said at least one pair of contacts are either both on a single conducting element or respectively on two adjacent conducting elements;
 supply means for providing an electrical signal to said at least one pair of brush contacts; and
 a decoder interconnected with each one of said conducting elements for generating two sets of different binary coded outputs in accordance with whether said at least one pair of brush contacts are contacting one or two of said conducting elements.

2. A digital code signal generating device as in claim 1, wherein said supply means includes a third brush contact electrically connected with said pair of brush contacts and a conducting strip disposed adjacent said at least one set of conducting elements, said third brush contact being in contact with said conducting strip; and an electrical power source connected with said conducting strip to provide said electrical signal.

3. A digital code signal generating device as in claim 1 wherein said at least one pair of brush contacts is connected respectively through at least one diode to a common point through which said electric signal is applied.

4. A digital code signal generating device as in claim 1 further comprising a pair of conducting strips electrically separated from each other and disposed adjacent said at least one set of conducting elements, and wherein said one of said pair of brush contacts bridges said set of conducting elements and said one of said conducting strips and the other of said pair of brush contacts bridges said set of conducting elements and the other of said conducting strips, and each one of said pair of brush contacts is connected respectively through a diode to a common point through which said electrical signal is applied.

5. A digital code signal generating device as in claim 4 further comprising a third pair of brush contacts mounted to travel on said conducting elements, and said supply means further includes an additional pair of diodes connected with said third pair of brush contacts to provide a second electrical signal thereto.

6. A digital code signal generating device as in claim 1 wherein said decoder includes a first set of gate members for generating a first signal with said at least one pair of brush contacts contact one of said conducting elements, and a second set of gate members for generating a second signal with said at least one pair of brush contacts contact two of said adjacent conducting elements.

7. A digital code signal generating device as in claim 6 wherein said decoder further includes a diode matrix circuit connected to said first and second set of gate members for generating binary coded signals.

8. A camera control mechanism using the digital code signal generating device as defined in claim 1, the camera having a diaphragm presetting ring for setting the diaphragm aperture, and further comprising means interconnecting said at least one pair of brush contacts and said diaphragm presetting ring to generate input signals to said decoder representative of the diaphragm aperture setting;

means for generating an optimum diaphragm aperture setting signal;

means for comparing the outputs of said decoder with said optimum diaphragm aperture setting signal and providing a control signal output when said decoder output and said aperture setting signal are substantially the same; and means for stopping the movement of said diaphragm presetting ring in response to said control signal output.

9. A camera control mechanism as in claim 8 wherein said interconnecting means includes a rotatable disc and said at least one pair of brush contacts being mounted in insulated relationship thereto, and linkage means connected to said disc and said diaphragm presetting means; said means for stopping including a gear meshing with said rotatable disc, ratchet wheel means meshing with said gear, and electromagnetically actuated claw means energized to engage said ratchet wheel in accordance with said control signal.

10. A digital code signal generating device as in claim 1 wherein said decoder includes means for generating a series of signals as said two sets of binary coded outputs, said series of signals changing sequentially with the advancement of said at least one pair of brush contacts, wherein a signal generated with said at least one pair of brush contacts being respectively on two adjacent conducting elements represents a value between values represented by signals generated with said brush contacts being both on either of the adjacent conducting elements.

11. A digital code signal generating device as in claim 1 wherein $2n-1$ different signals are generated by said brush contacts where n is the number of conducting elements.

* * * * *

UNITED STATES PATENT OFFICE
CERTIFICATE OF CORRECTION

PATENT NO. : 4,212,000
DATED : July 8, 1980
INVENTOR(S) : Yamada

It is certified that error appears in the above-identified patent and that said Letters Patent are hereby corrected as shown below:

[30]  Foreign Application Priority Data

Aug. 20, 1977 [JP]  Japan .......... 52-100017
Sept. 2, 1977 [JP]  Japan .......... 52-106016

Signed and Sealed this

Seventeenth Day of February 1981

[SEAL]

Attest:

RENE D. TEGTMEYER

Attesting Officer     Acting Commissioner of Patents and Trademarks